United States Patent
Lin et al.

(10) Patent No.: US 12,342,587 B2
(45) Date of Patent: Jun. 24, 2025

(54) INTEGRATED CIRCUIT WITH NANOSTRUCTURE TRANSISTORS AND BOTTOM DIELECTRIC INSULATORS

(71) Applicant: Taiwan Semiconductor Manufacturing Co., Ltd., Hsinchu (TW)

(72) Inventors: Zhi-Chang Lin, Hsinchu (TW); Chien Ning Yao, Hsinchu (TW); Shih-Cheng Chen, Hsinchu (TW); Jung-Hung Chang, Hsinchu (TW); Tsung-Han Chuang, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 505 days.

(21) Appl. No.: 17/693,204

(22) Filed: Mar. 11, 2022

(65) Prior Publication Data
US 2023/0028900 A1 Jan. 26, 2023

Related U.S. Application Data

(60) Provisional application No. 63/225,101, filed on Jul. 23, 2021.

(51) Int. Cl.
| | | |
|---|---|---|
| H01L 29/06 | (2006.01) | |
| H01L 21/8234 | (2006.01) | |
| H10D 30/01 | (2025.01) | |
| H10D 30/67 | (2025.01) | |
| H10D 62/10 | (2025.01) | |
| H10D 84/01 | (2025.01) | |

(Continued)

(52) U.S. Cl.
CPC ........ *H10D 62/118* (2025.01); *H10D 30/031* (2025.01); *H10D 30/6713* (2025.01); *H10D 30/6757* (2025.01); *H10D 62/115* (2025.01); *H10D 84/0128* (2025.01); *H10D 84/013* (2025.01); *H10D 84/038* (2025.01); *H10D 84/834* (2025.01)

(58) Field of Classification Search
None
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |

(Continued)

FOREIGN PATENT DOCUMENTS

| | | |
|---|---|---|
| CN | 113078153 A | 7/2021 |
| TW | 201913821 A | 4/2019 |
| TW | 202119639 A | 5/2021 |

*Primary Examiner* — Asok K Sarkar
(74) *Attorney, Agent, or Firm* — Seed IP Law Group

(57) ABSTRACT

An integrated circuit includes a first nanostructure transistor including a plurality of first semiconductor nanostructures over a substrate and a source/drain region in contact with each of the first semiconductor nanostructures. The integrated circuit includes a second nanostructure transistor including a plurality of second semiconductor nanostructures and a second source/drain region in contact with one or more of the second semiconductor nanostructures but not in contact with one or more other second semiconductor nanostructures.

20 Claims, 14 Drawing Sheets

(51) Int. Cl.
    *H10D 84/03*     (2025.01)
    *H10D 84/83*     (2025.01)

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 10,256,301 B1 * | 4/2019 | Reznicek .............. H01L 29/167 |
| 2019/0067125 A1 * | 2/2019 | Chiang .............. H01L 29/0653 |
| 2020/0144376 A1 | 5/2020 | Hitora et al. |
| 2021/0210349 A1 | 7/2021 | Xie et al. |

* cited by examiner

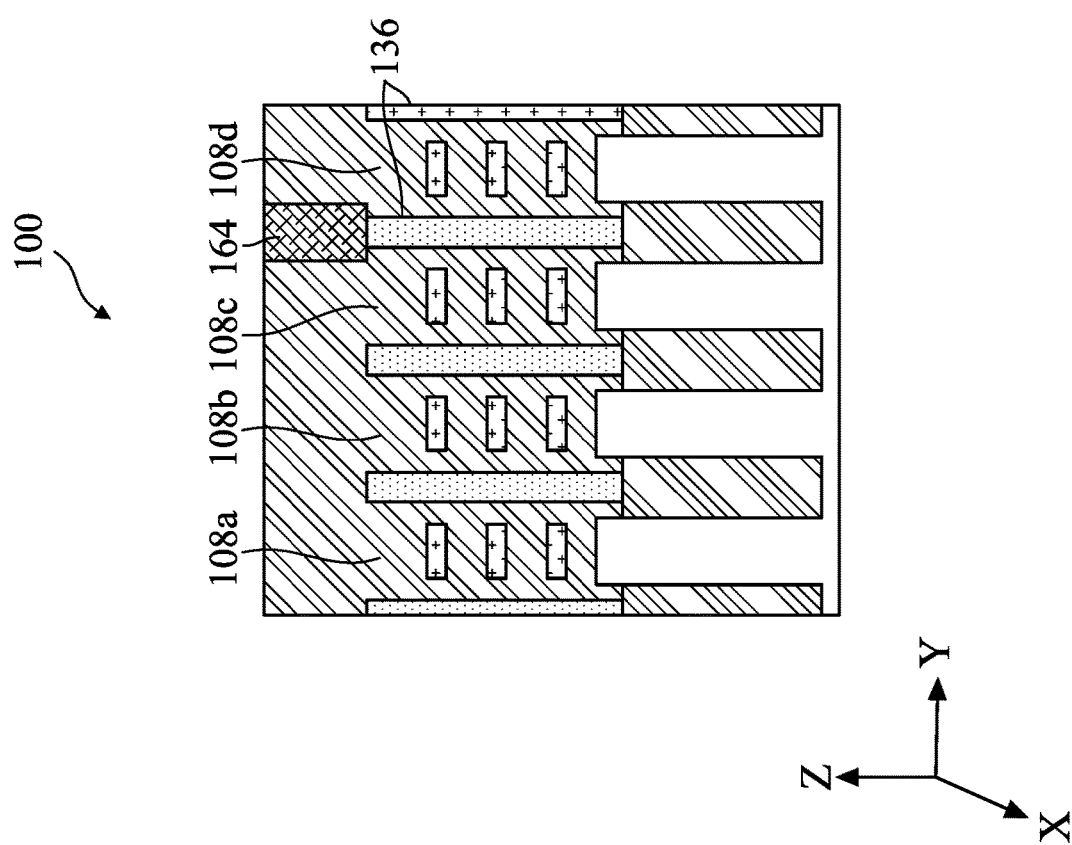
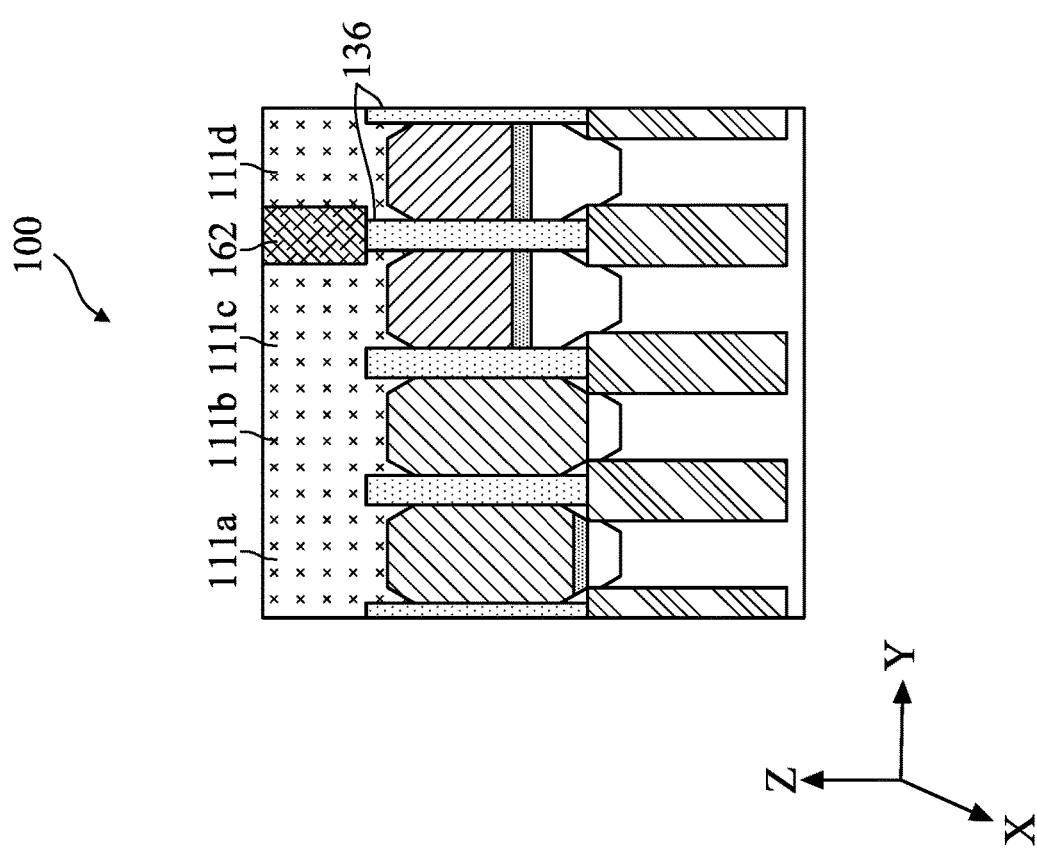
Figure 2K
Figure 2L

INTEGRATED CIRCUIT WITH NANOSTRUCTURE TRANSISTORS AND BOTTOM DIELECTRIC INSULATORS

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanostructure transistors can assist in increasing computing power because the nanostructure transistors can be very small and can have improved functionality over conventional transistors. A nanostructure transistor may include a plurality of semiconductor nanostructures (e.g. nanowires, nanosheets, etc.) that act as the channel regions for a transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2L are cross-sectional views of an integrated circuit at various stages of processing, in accordance with some embodiments.

DETAILED DESCRIPTION

Figure 1A:
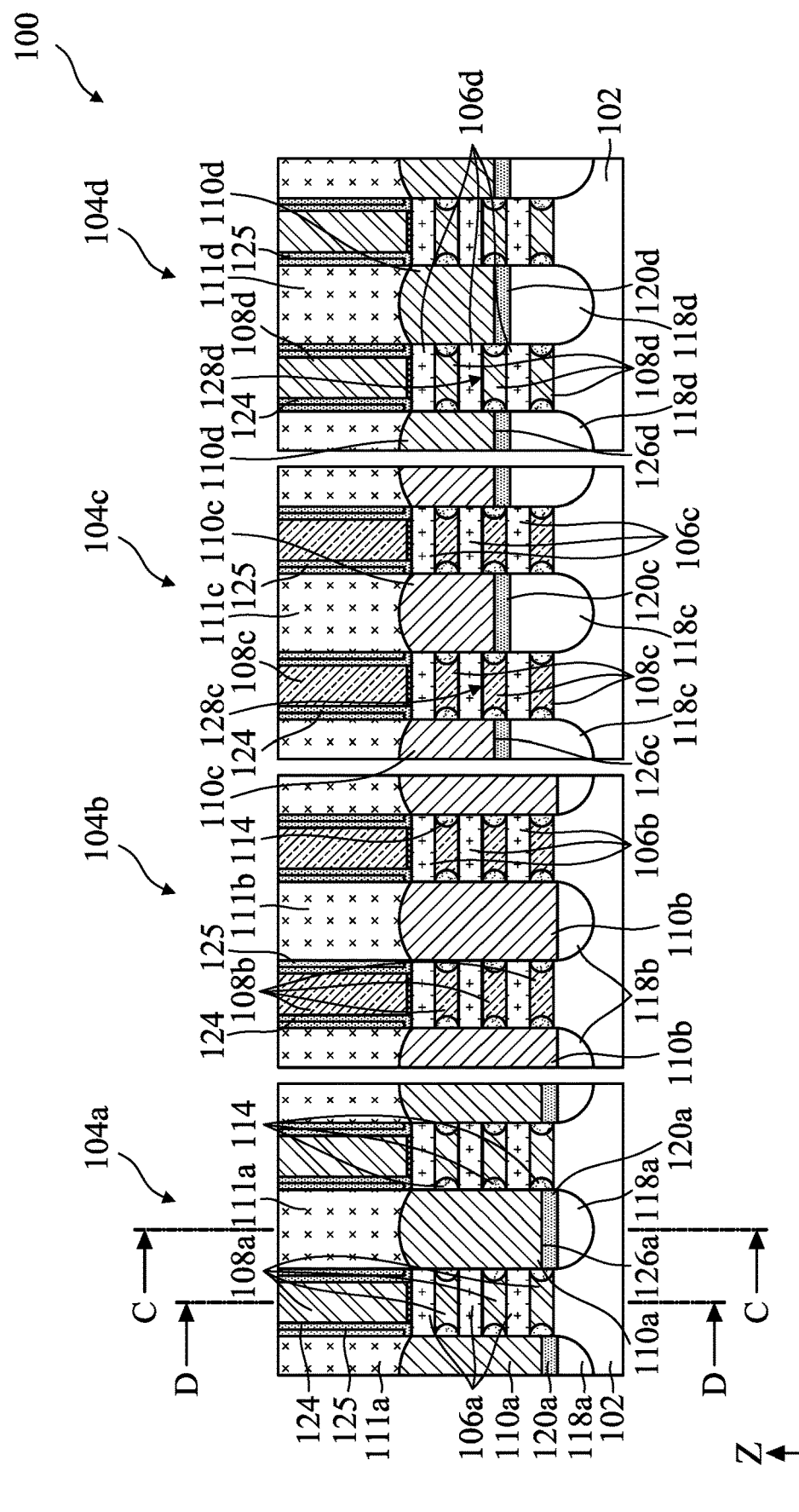
FIGS. 1A-1D are views of an integrated circuit, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with nanostructure transistors having differing effective channel widths while having substantially the same area overheads. Each transistor has a plurality of stacked nanostructures corresponding to the channel regions of the transistors. The effective channel width of each transistor corresponds to the combined widths of the stacked nanostructures. Each transistor initially has a same number of stacked nanostructures. The effective channel width of a transistor is adjusted by forming the source/drain regions to connect only to a selected number of the stacked nanostructures. The depth of the source/drain regions is controlled by selectively performing an epitaxial growth that effectively extends the height of the substrate in regions for which fewer channels will be connected to the source/drain regions. The larger the number of nanostructures connected to the source/drain regions of a transistor, the larger the effective channel width of the transistor.

Selectively controlling the effective channel width as described above enables formation of transistors or groups of transistors with specific characteristics. For example, lower power devices can be formed by reducing the number of channels connected to the source/drain regions. Higher speed devices can be formed by connecting a larger number of channels to the source/drain regions. Furthermore, transistors having differing effective channel widths can take up substantially the same amount of substrate area. The result is an integrated circuit that has dedicated high-speed devices and low power devices without increased design complexity and without area penalties. Device performance and wafer yield are improved.

FIG. 1A is a cross-sectional view of an integrated circuit 100, in accordance with some embodiments. The integrated circuit 100 includes a substrate 102. The integrated circuit also includes four transistors 104a, 104b, 104c, and 104d. As will be set forth in more detail below, the transistors 104a-d include varying effective channel widths without consuming substantially different amounts of integrated circuit area.

The transistors 104a-d may correspond to gate all around transistors. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure. Furthermore, the gate all around transistors 104a-d may each include a plurality of semiconductor nanostructures corresponding to channel regions of the transistors 104a-d. The nanostructures may include nanosheets, nanowires, or other types of nanostructures.

In some embodiments, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In an example process described herein, the substrate 102 includes Si, though other semiconductor materials can be utilized without departing from the scope of the present disclosure.

The transistor 104a includes a plurality of nanostructures 106a. The nanostructures 106a are stacked in the vertical direction or Z direction. In the example of FIG. 1A, there are three stacked nanostructures 106a. However, in practice, there may be only two stacked nanostructures 106a or there may be more than three stacked nanostructures 106a without departing from the scope of the present disclosure. The nanostructures 106a correspond to channel regions of the transistor 104a.

The nanostructures 106a may include one or more layers of Si, SiGe, or other semiconductor materials. Other semiconductor materials can be utilized for the nanostructures 106a without departing from the scope of the present disclosure. In a non-limiting example described herein, the nanostructures 106a are silicon. The vertical thickness of the nanostructures 106a can be between 3 nm and 10 nm. The semiconductor nanostructures 106a may be separated from each other by 3 nm to 15 nm. Other thicknesses and materials can be utilized for the nanostructures 106a without departing from the scope of the present disclosure.

The transistor 104a includes a gate metal 108a. The gate metal 108a surrounds the nanostructures 106a. The gate metal 108a corresponds to a gate electrode, or they correspond to one of the metals that make up a gate electrode of the substrate 102. The gate metal 108a can include one or more of titanium nitride, tungsten, tantalum, tantalum nitride, tantalum aluminum nitride, ruthenium, cobalt, aluminum, titanium, or other suitable conductive materials. The gate metal 108a may have a length in the X direction between 5 nm and 150 nm. Other materials and thicknesses can be utilized for the gate metal 108a without departing from the scope of the present disclosure.

The transistor 104a includes source/drain regions 110a. The source/drain regions 110a are both in contact with each of the nanostructures 106a. Each nanostructure 106a extends in the X direction between the source/drain regions 110a. The source/drain regions 110a include a semiconductor material. The source/drain regions 110a can be doped with N-type dopants species in the case of an N-type transistor. The N-type dopant species can include P, As, or other N-type dopant species. The source/drain regions 110a can be doped with P-type dopant species in the case of a P-type transistor. The P-type dopant species can include B or other P-type dopant species. The doping can be performed in-situ during the epitaxial growth. The source/drain regions 110a can include other materials and structures without departing from the scope of the present disclosure. In the case of N-type transistors, the source/drain region 110a can include Si, SiC, or other semiconductor materials. In the case of P-type transistors, the source/drain region 110a can include Si, SiC, or other semiconductor materials.

The transistor 104a includes a gate dielectric (not shown). The gate dielectric is positioned between the gate metal 108a and the nanostructures 106a. The gate dielectric surrounds the nanostructures 106a. The gate metal 108a surrounds the gate dielectric.

In some embodiments, the gate dielectric includes a high-K gate dielectric layer and an interfacial gate dielectric layer. The interfacial gate dielectric layer is a low-K gate dielectric layer. The interfacial gate dielectric layer is in contact with the nanostructures 106a. The high-K gate dielectric layer is in contact with the low-K gate dielectric layer and the gate metal 108a. The interfacial gate dielectric layer is positioned between the nanostructures 106a and the high-K gate dielectric layer. The low-K gate dielectric layer may be termed an interfacial gate dielectric layer.

The interfacial gate dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The high-K gate dielectric layer includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes $HfO_2$ with dipole doping including La and Mg, and a second layer including a higher-K ZrO layer with crystallization.

The transistor 104a includes inner spacers 114. The inner spacers 114 can include silicon oxide, silicon oxynitride, silicon carbonitride, silicon oxycarbonitride, fluorine-doped silicate glass (FSG), a low-K dielectric material or other dielectric materials without departing from the scope of the present disclosure. The inner spacers 114 physically separate the gate metal 108a from the source/drain regions 110a. This prevents short circuits between the gate metal 108a and the source/drain regions 110a. The inner spacers 114 may have a thickness between 2 nm and 10 nm. Other materials, dimensions, and structures can be utilized for the inner spacers 114 without departing from the scope of the present disclosure. The inner spacers may have a thickness between 2 nm and 10 nm.

The transistor 104a includes source/drain contacts 111a. Each source/drain contact 111a is positioned over and electrically connected to a respective source/drain region 110a. Electrical signals may be applied to the source/drain regions 110a via the source/drain contacts 111a. The source/drain contacts 111a can include a conductive material such as tungsten, cobalt, ruthenium, titanium, aluminum, tantalum, or other suitable conductive materials. The source/drain contacts may have a width in the X direction between 5 nm and 50 nm.

The transistor 104a may include silicide (not shown). The silicide is formed at the top of the source/drain regions 110a. The source/drain contacts 111a are positioned in contact with the silicide. The silicide promotes good electrical connection between the source/drain contacts 111a and the source/drain regions 110a. The silicide can include titanium silicide, aluminum silicide, nickel silicide, tungsten silicide, or other suitable silicides. The source/drain contacts 111a may have a width between 5 nm and 50 nm.

The transistor 104a includes an epitaxial semiconductor layer 118a. The epitaxial semiconductor layer 118a may include an intrinsic semiconductor material. The epitaxial semiconductor layer 118a may be formed with an epitaxial growth process from the substrate 102 after the etching process forms recesses in the substrate 102. The epitaxial layer 118a has a top surface that is lower than the bottom surface of the bottom semiconductor nanostructure 106a. The epitaxial semiconductor layer 118a may include the same semiconductor material as the substrate 102 or may include a different semiconductor material. The epitaxial semiconductor layer 118a may include silicon, silicon germanium, or other suitable semiconductor materials.

The transistor 104a also includes dielectric isolation structures 120a below the source/drain regions 110a. In particular, a respective dielectric isolation structure 120a is positioned between the semiconductor substrate 102 and each of the source/drain regions 110a. The dielectric isolation structures 120a may be positioned in contact with a top surface of the semiconductor substrate 102 and the bottom surfaces 126a of the source/drain regions 110a.

The dielectric isolation structures 120a are positioned in direct contact with the epitaxial semiconductor regions 118a. The source/drain regions 110a are in direct contact with the dielectric isolation structures 120a. The dielectric isolation structures 120a may include SiN, SiON, SiOCN, SiOC, SiCN, SiO, AlO, HfO, or other suitable dielectric materials. The dielectric isolation structure 120a may have a thickness between 1 nm and 15 nm. This thickness may be sufficiently thick to ensure substantially no leakage current, but not so thick as to adversely affect the potential thickness of a source/drain region that will be formed thereon. Other thicknesses and materials can be utilized for the dielectric isolation structures 120a without departing from the present disclosure.

The presence of the dielectric isolation structures 120a ensures that leakage currents will not flow from the source/drain regions 110a into the semiconductor substrate 102. This can greatly enhance the efficiency of the first transistor 104a by substantially eliminating leakage currents. This reduces power consumption and heat generation.

The transistor 104a includes a pair of dielectric layers 124 and 125. The dielectrics layer 124 and 125 may collectively function as gate spacer layers positioned between the gate electrode 108a and the source/drain contact 111a. The dielectric layer 124 may be positioned in contact with the gate metal 108a and may include SiN, SiON, SiOCN, SiCN, or other suitable dielectric materials. The dielectric layer 125 may include silicon oxide or another suitable dielectric material. The dielectric layers 124 may include fewer or more dielectric layers than two.

The transistor 104a can be operated by applying voltages to the source/drain regions 110a and the gate metal 108a. The voltages can be applied to the source/drain regions 110a via the source/drain contacts 111a. The voltages can be applied to the gate metal 108a via a gate contact not shown in FIG. 1A. The voltages can be selected to turn on the transistor 104a or to turn off the transistor 104a. When the transistor 104a is turned on, currents may flow between the source/drain regions 110a through each of the nanostructures 106a. When the transistor 104 is turned off, currents do not flow through the nanostructures 106a.

In the transistor 104a, each of the semiconductor nanostructures 106a is in contact with the source/drain regions 110a. Accordingly, each of the semiconductor nanostructures 106a passes currents between the source/drain regions 110a when the transistor 104a is turned on. The bottom surface 126a of the source/drain regions 110a is lower than the bottom surface of the lowest semiconductor nanostructure 106a.

The transistor 104a has a channel length corresponding to the distance in the X direction between the source/drain regions 108a. The transistor 104a has an effective channel width corresponding to the sum of the widths of each of the semiconductor nanostructures 106a. The width of an individual semiconductor nanostructure 106a corresponds to the dimension of the semiconductor nanostructure 106a in the Y direction. Accordingly, because there are three semiconductor nanostructures 106a in contact with the source/drain regions 110a, the total effective channel width of the transistor 104a is three times the width of an individual semiconductor nanostructure 106a.

The amount of current that flows through a transistor is based, in part, on the width of the channel of the transistor. If the same voltages are applied to the terminals of two transistors that are identical other than in their channel widths, the transistor having the wider channel will pass a larger current than the transistor having the narrower channel. The transistor having the narrower channel will consume less power than the transistor having the wider channel. The transistor having a wider channel will be able to turn on and off more quickly.

It may be beneficial for an integrated circuit to include transistors that have different channel widths in order to provide some transistors that consume less power and other transistors with faster performance. This can be accomplished by having transistors with differing widths, as described above. One solution to accomplish this is to form some transistors that take up a larger area of substrate than others. However, this has the drawback of potentially consuming greater amounts of area in order to provide transistors with wide channels.

The integrated circuit 100 provides transistors with differing effective channel widths while consuming substantially the same amount of area. This is accomplished by connecting different numbers of stacked semiconductor nanostructures to the source/drain regions of transistors. While each transistor may include the same number of stacked semiconductor nanostructures, transistors with smaller channel widths can be formed by selectively connecting only a subset of the total available number of semiconductor nanostructures to the source/drain regions of the transistors.

In FIG. 1A, the transistors 104b-104d have many of the same types of components and structures as the transistors 104a. The structures of the transistors 104b-d that have an analogous structure in the transistor 104a are labeled with the same reference numbers but with different suffix letters. For example, the transistor 104b includes semiconductor nanostructures 106b, the transistor 104c includes semiconductor nanostructures 106c, and the transistor 104d includes semiconductor nanostructures 106d. In describing the transistors 104b-104d, the differences between the transistors 104b-104d and the transistor 104a will be highlighted without describing the structures that may are substantially similar to the structures associated with the transistor 104a.

In one embodiment, the transistors 104a and 104d have a same first conductivity type as each other. The transistors 104b and 104c have a same second conductivity type as each other. The second conductivity type is opposite to the first conductivity type. In one example, the first conductivity type is N-type while the second conductivity is P-type. Accordingly, the source/drain regions 110a and 110d of the transistors 104a and 104d may be doped with N-type dopants, while the source/drain regions 110b and 110c of the transistors 104b and 104c may be doped with P-type dopants. There may be other doping differences between the transistors 104a and 104d and the transistors 104b and 104c.

In FIG. 1A, the transistors 104a and 104b have substantially the same effective channel widths. This is because both the transistors 104a and 104b have the same number (three) of semiconductor nanostructures 106a and 106b coupled between the source/drain regions 110a and 110b. The transistor 104b may differ from the transistor 104a in that the transistor 104a includes dielectric isolation structures 120a between the source/drain regions 110a and the epitaxial semiconductor regions 118a, while the transistor 104b does not include an analogous dielectric isolation structure between the source/drain regions 110b and the epitaxial semiconductor regions 118b. One reason for this is that the source/drain regions 110b may have a crystallized mismatch with the epitaxial semiconductor regions 118b that imparts a beneficial strain to the source/drain regions 110b. The strain may improve the conductivity of the source/drain regions 110b. Accordingly, in some cases, the P-type transistor 104b may not include dielectric isolation structures isolating the source/drain regions 110b from the epitaxial semiconductor regions 118b. In other cases, the P-type transistor 104b may also include dielectric isolation structures similar to the dielectric isolation structures 120a of the transistor 104a.

The transistors 104c and 104d have smaller effective channel widths than the transistors 104a and 104b. This is because the lowest semiconductor nanostructures 106c and 106d of the transistors 104c and 104d are not connected to the source/drain regions 110c and 110d. The epitaxial semiconductor regions 118c and 118d of the transistors 104c and 104d have a greater height than the epitaxial semiconductor regions 118a and 118b of the transistors 104a and 104b. In particular, the epitaxial semiconductor regions 118c and 118d are in contact with the lowest semiconductor nanostructures 106c and 106d.

Dielectric isolation structures 120c and 120d are positioned on the epitaxial semiconductor regions 118c and 118d. The top surfaces of the dielectric isolation structures 120c and 120d are higher than the top surfaces 128c and 128d of the lowest semiconductor nanostructures 106c and 106d of the transistors 104c and 104d. Further details regarding the materials and processes for forming the dielectric isolation structures 120a-d and the epitaxial semiconductor regions 118a-d are provided in relation to FIGS. 2C-2E.

The source/drain regions 110c and 110d are formed on top of the dielectric isolation structures 120c and 120d. Because the top surfaces of the dielectric isolation structures 120c and 120d are higher than the top surfaces 128c and 128d of the lowest semiconductor nanostructures 106c and 106d, the source/drain regions 110c and 110d do not contact the lowest semiconductor nanostructures 106c and 106d. Said another way, the bottom surfaces 126c and 126d of the source/drain regions 110c and 110d are higher than the top surfaces 128c and 128d of the lowest semiconductor nanostructures 106c and 160d. The result is that the lowest semiconductor nanostructures 106c and 106d of the transistors 104c and 104d do not function as channel regions of the transistors 104c and 104d. Thus, the total effective channel width of the transistors 104c and 104d is two times the width of an individual semiconductor nanostructure 106c or 106d. In the example FIG. 1A, the effective channel widths of the transistors 104c and 104d is two-thirds the effective channel width of the transistors 104a and 104b.

In some embodiments, the transistors 104c and 104d may be formed such that two or more of the lowest semiconductor nanostructures 106c and 106d are not connected to the source/drain regions 110c and 110d, depending on the total number of available semiconductor nanostructures and design selections.

Figure 1B:
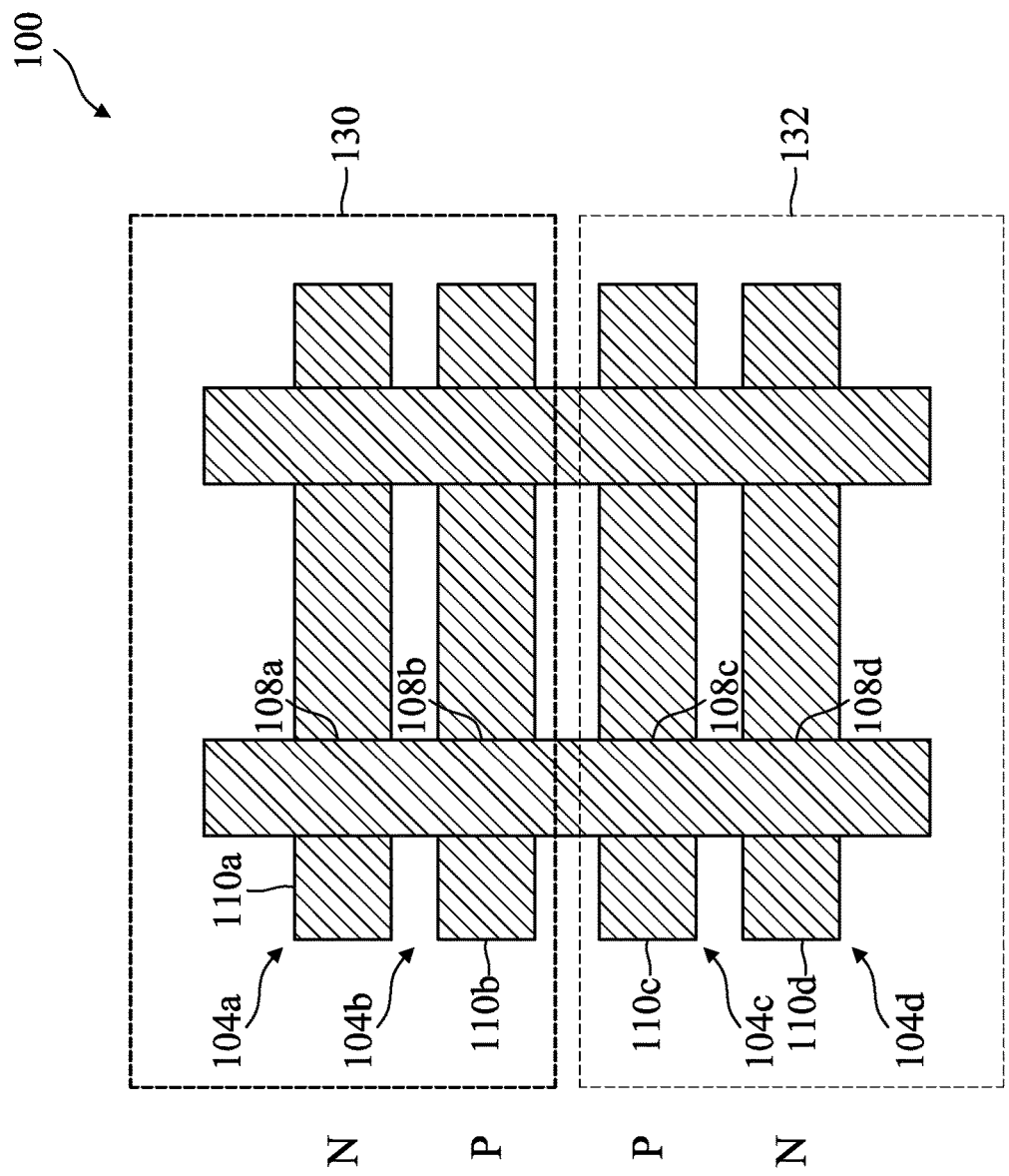

FIG. 1B is a simplified top view of an integrated circuit 100, in accordance with some embodiments. The top view of FIG. 1B illustrates two cells of transistors in accordance with principles shown in FIG. 1A. In particular, a first cell 130 is designed for speed. Accordingly, the first cell 130 includes the transistor 104a and the transistor 104b that have relatively wider effective channel widths, as described in relation to FIG. 1A. The second cell 132 is designed for reduced power consumption. Accordingly, the second cell 132 includes the transistor 104c and the transistor 104d that have relatively smaller effective channel widths as described in relation to FIG. 1A.

In FIG. 1B the gate metals 108a-d are illustrated as a single contiguous gate metal for all four of the transistors. In practice, the gate metals 108a-d may be contiguous with each other or may be electrically isolated from each other. FIG. 1B also illustrates the source/drain regions 110a-d on either side of the gate metals 108a-d. In practice, the transistors 104a-d may be arranged differently than shown in FIG. 1B and will include additional components not shown in FIG. 1B for simplicity.

Figure 1C:
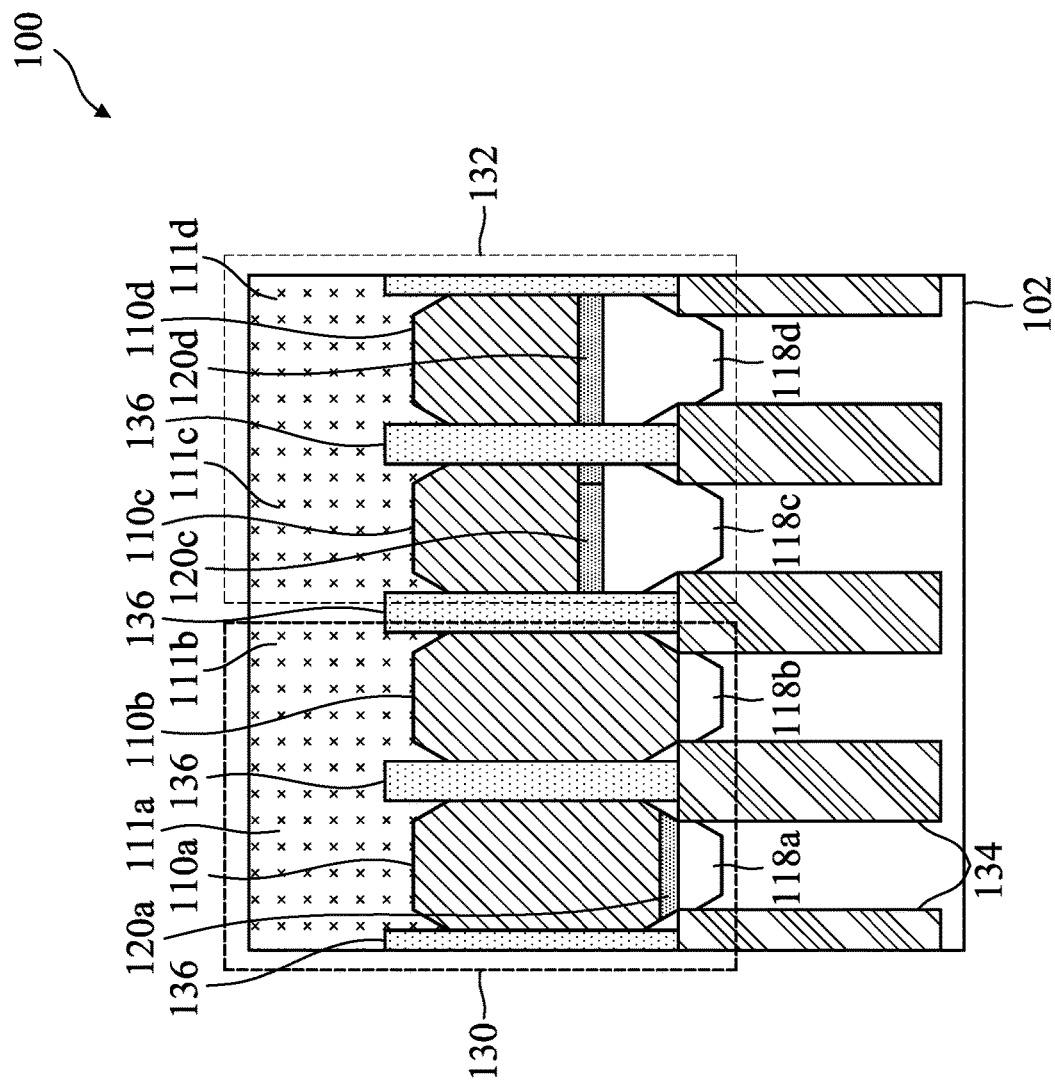

FIG. 1C is a cross-sectional view of the integrated circuit 100 of FIG. 1A taken along cut lines C, in accordance with some embodiments. FIG. 1C illustrates the hybrid fin structures 136 separating the source/drain regions 110a-d from each other. In FIG. 1C, the hybrid fin structures 136 are shown as a single layer. However, in practice, the hybrid fin structures 136 may include multiple layers. The dielectric materials of the hybrid fin structures 136 can include one or more of SiN, SiON, SiOCN, SiOC, SiCN, SiO, AlO, HfO, or other suitable dielectric materials. The width of the hybrid fin structures 136 may be smaller than a width of the shallow trench isolation regions 134.

In one embodiment, the hybrid fin structures 136 include a first dielectric layer, a second dielectric layer, and a high-K dielectric layer. In some embodiments, the first dielectric layer includes silicon nitride. In some embodiments, the second dielectric layer includes silicon oxide. The high-K dielectric layer can include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer may be termed a helmet layer for the hybrid fin structures 136. Other materials and structures can be utilized for the dielectric layers without departing from the scope of the present disclosure.

FIG. 1C also illustrates shallow trench isolation regions 134 in the substrate 102 below the hybrid fin structures 136. The dielectric material for the shallow trench isolation regions 134 may include silicon oxide, silicon nitride, silicon oxynitride (SiON), SiOCN, SiCN, fluorine-doped silicate glass (FSG), or a low-K dielectric material. Other materials and structures can be utilized for the shallow trench isolation regions 134 without departing from the scope of the present disclosure.

FIG. 1C also illustrates source/drain contact regions 111a-d in electrical contact with the source/drain regions 110a-d. While FIG. 1C illustrates the source/drain contact regions 111a-d as a single contiguous structure, in practice, the source/drain contact regions 111a-d may include a single contiguous structure or electrically isolated structures. FIG. 1C also illustrates that the source/drain regions 110a and 110b have a greater dimension in the vertical direction Z than do the source/drain regions 110c and 110d.

Figure 1D:
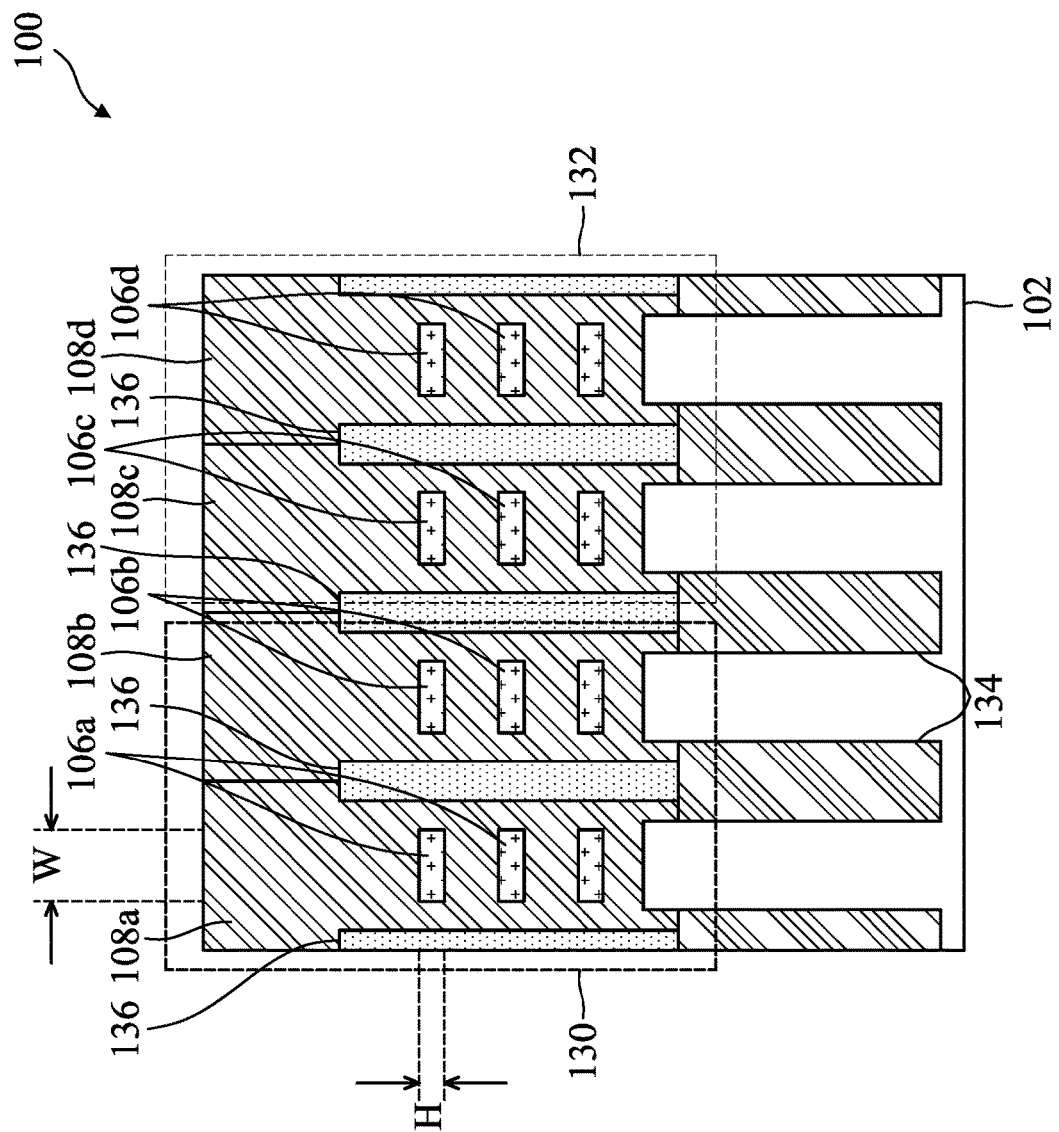

FIG. 1D is a cross-sectional view of the integrated circuit 100 of FIG. 1A taken along cut lines D, in accordance with some embodiments. The view of FIG. 1D illustrates that the gate electrodes 108a-d surround the semiconductor nanostructures 106a-d. As described previously in relation to FIG. 1B, the gate metals 108a-d may be a single contiguous gate metal or may be electrically isolated from each other.

FIG. 1D also illustrates the width W in the Y direction of the semiconductor nanostructures 106a-d. In some embodiments, the width W is between 5 nm and 20 nm. However, other dimensions can be utilized for the width W of the semiconductor nanostructures 106a-d without departing from the scope of the present disclosure. The effective width Weff of a transistor may be given by the following relationship:

$$Weff = n*W,$$

where n is the number of semiconductor nanostructures electrically connected to the source/drain region of the transistor. In the example of FIG. 1A, n=3 for the transistors 104a and 104b, and n=2 for the transistors 104c and 104d. In another formulation, the effective width of the transistor can be given by the following relationship:

$$Weff = n*(W+H),$$

where H is the vertical height or thickness of an individual semiconductor nanostructure. In some embodiments, H can be between 3 nm and 10 nm, though other values for H can be utilized without departing from the scope of the present disclosure.

FIG. 1D illustrates a benefit of principles of the present disclosure. The transistors 104a and 104b have different effective channel widths than the transistors 104c and 104d, yet each of the transistors 104a-d have substantially the same dimensions and the Y direction. This can greatly simplify layout and process formulations for forming the integrated circuit 100.

Figure 2A:
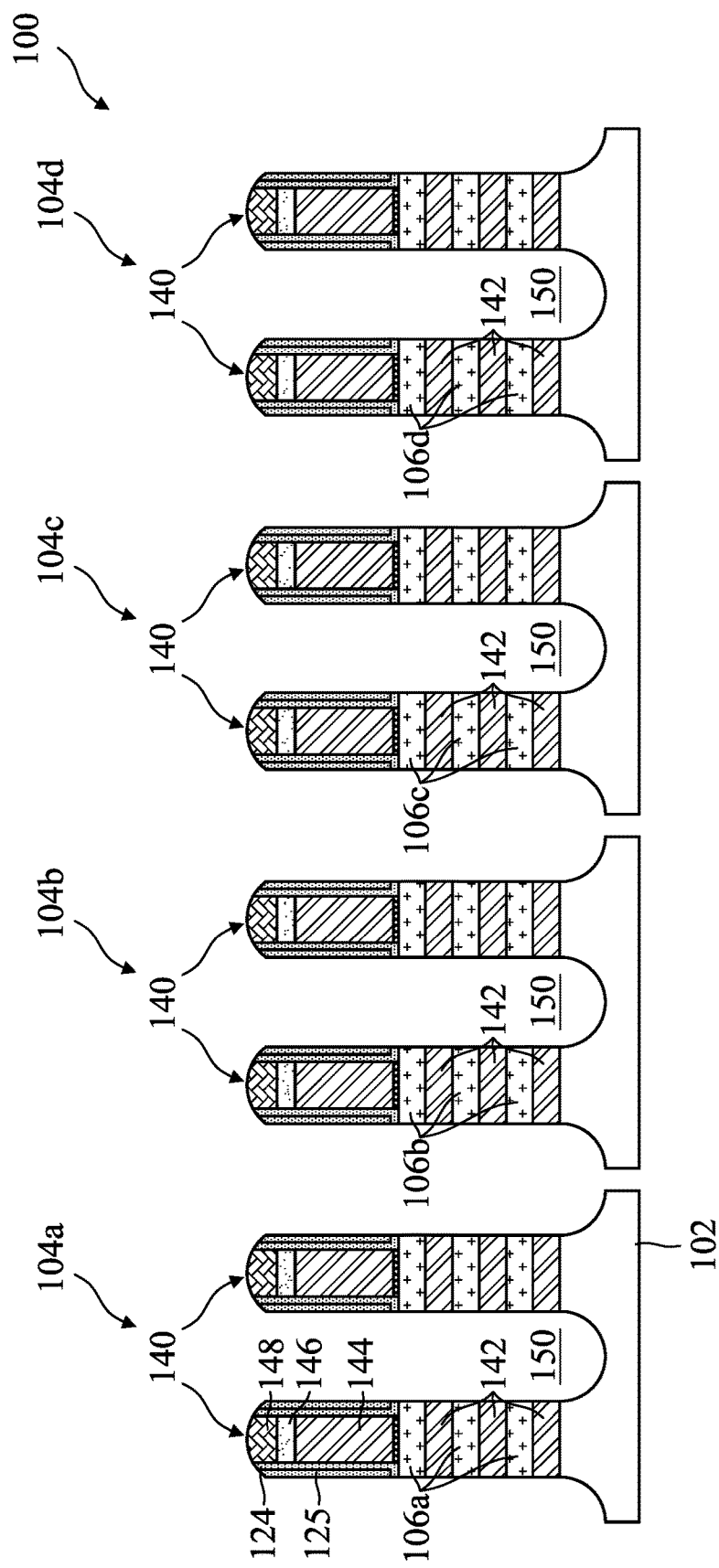

FIGS. 2A-2L are cross-sectional views of an integrated circuit 100 at intermediate stages of processing, in accordance with some embodiments. FIG. 2A illustrates the locations of four different transistors 104a-d on a substrate 102. The substrate 102 may include materials and structures as described in relation to FIG. 1A.

The integrated circuit 100 includes, for each transistor 104a-d, a semiconductor stack. The semiconductor stack for each transistor 104a-d includes a plurality of semiconductor nanostructures 106a-d. The semiconductor stack for each transistor 104a-d includes a plurality of sacrificial semiconductor nanostructures 142. The semiconductor nanostructures 106a-d can have materials, compositions, and dimensions as described in relation to FIG. 1A. The sacrificial semiconductor nanostructures are positioned between the semiconductor nanostructures 106a-d. Further details regarding the sacrificial semiconductor nanostructures 142 is provided below.

The integrated circuit 100 includes a plurality of dummy gate structures 140, each positioned over a respective semiconductor stack. The dummy gate structures 140 are placed on locations at which gate electrodes of the transistors 104a-d will be placed. The dummy gate structures 140 are above the channel regions of the transistors 104a-d, as will be set forth in more detail below.

The dummy gate structures 140 each include a layer of polysilicon 144. The layer of polysilicon 144 can have a thickness between 20 nm and 100 nm. The layer of polysilicon 144 can be deposited by an epitaxial growth, a CVD process, a physical vapor deposition (PVD) process, or an ALD process. Other thicknesses and deposition processes can be used for depositing the layer of polysilicon 144 without departing from the scope of the present disclosure.

The dummy gate structures 140 each include a dielectric layer 146 on the layer of polysilicon 144 and a dielectric layer 148 on the dielectric layer 146. In one example, the dielectric layer 146 includes silicon nitride. In one example, the dielectric layer 148 includes silicon oxide. The dielectric layers 146 and 148 can be deposited by CVD. The dielectric layer 146 can have a thickness between 5 nm and 15 nm. The dielectric layer 148 can have a thickness between 15 nm and 50 nm. Other thicknesses, materials, and deposition processes can be utilized for the dielectric layers 146 and 148 without departing from the scope of the present disclosure.

A spacer layer 124 has been deposited on the polysilicon layer 144 and the dielectric layers 146 and 148. The spacer layer can include silicon nitride, SiOCN, or other suitable dielectric layers. The spacer layer 124 can be deposited by CVD, PVD, ALD, or other suitable processes. The spacer layer 124 can have a thickness between 2 nm and 10 nm. The spacer layer 124 can have other materials, deposition processes, and thicknesses without departing from the scope of the present disclosure.

A dielectric layer 125 has been deposited on the spacer layer 124. The dielectric layer 125 can include silicon nitride, SiOCN, or other suitable dielectric layers. The dielectric layer 125 can be deposited by CVD, PVD, ALD, or other suitable processes. The dielectric layer 125 can have a thickness between 2 nm and 10 nm. The dielectric layer 125 may have the same material or a different material from the spacer layer 124. Furthermore, the spacer layer 124 and the dielectric layer 125 may jointly be considered a spacer layer for the dummy gates 140. The dielectric layer 125 can have other materials, deposition processes, and thicknesses without departing from the scope of the present disclosure. The total thickness in the X direction of the dielectric layers 124 and 125 may be between 3 nm and 10 nm.

The integrated circuit 100 includes trenches 150 between the semiconductor stacks. More particularly, the process of forming or defining the semiconductor stacks may include forming the trenches 150. The trenches 150 also extend into the substrate 102.

The sacrificial semiconductor nanostructures 142 include a different semiconductor material than the semiconductor nanostructures 106a-d. In an example in which the semiconductor nanostructures 106a-d include silicon, the sacrificial semiconductor nanostructures 142 may include SiGe. In some embodiments, the semiconductor nanostructures 106a-d and the sacrificial semiconductor nanostructures 142 are formed by alternating epitaxial growth processes from the semiconductor substrate 102. Alternating epitaxial growth processes are performed until a selected number of semiconductor nanostructures 106a-d and sacrificial semiconductor nanostructures 142 have been formed.

Figure 2B:
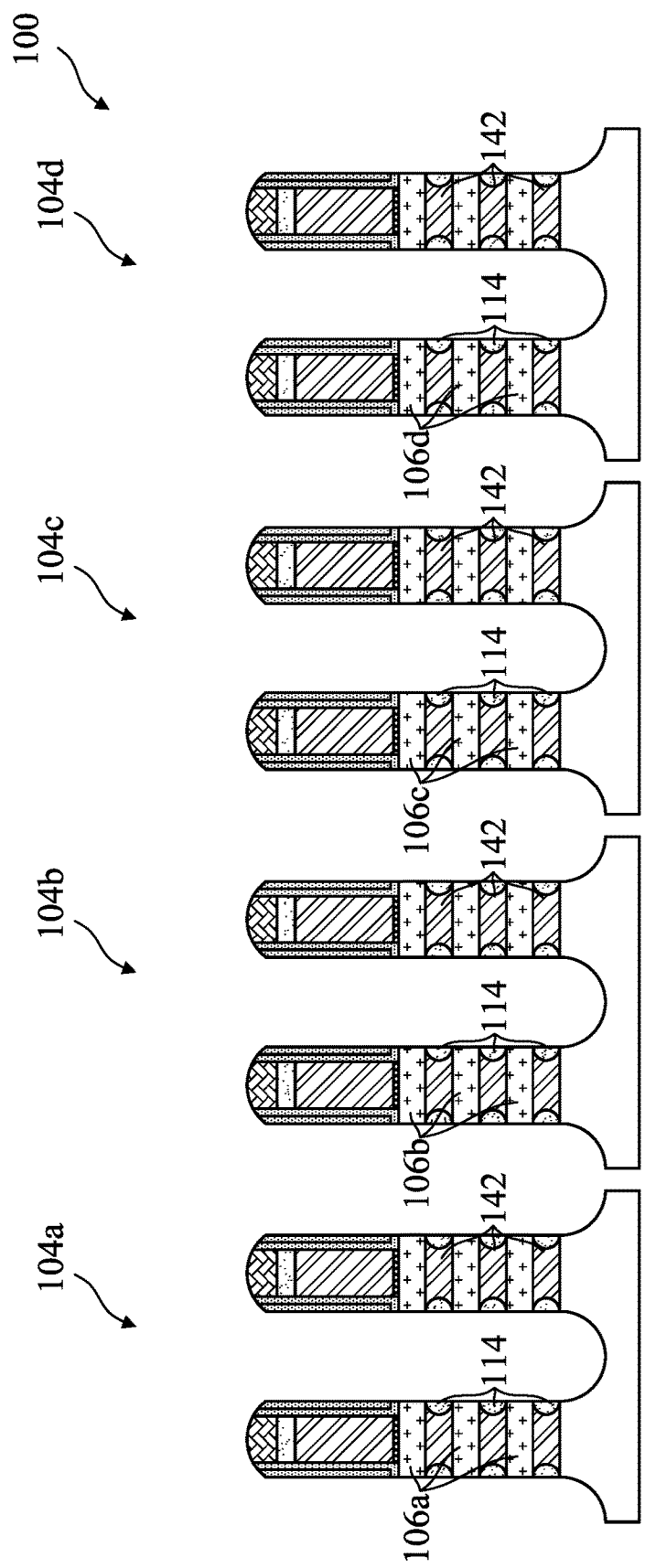

In FIG. 2B, a recess step has been performed to recess the sacrificial semiconductor nanostructures 142. The recessing process removes outer portions of the sacrificial semiconductor nanostructures 142 without entirely removing the sacrificial semiconductor nanostructures 142. The recessing process can be performed with an anisotropic etch that selectively etches the material of the sacrificial semiconductor nanostructures 142 with respect to the materials of the semiconductor nanostructures 106a-d and the substrate 102. The anisotropic etching process can include a timed etching process. The duration of the etching process is selected to remove only a portion of the sacrificial semiconductor nanostructures 142 without entirely removing the sacrificial semiconductor nanostructures 142.

In FIG. 2B, dielectric spacers 114 have been deposited between the exposed portions of the semiconductor nanostructures 106a-d. In particular, the dielectric spacers 114 are formed at the locations where the sacrificial semiconductor nanostructures 142 have been recessed. The dielectric spacers 114 can be deposited by an ALD process, a CVD process, or other suitable processes. In one example, the dielectric spacers 114 include silicon nitride. Other materials and deposition processes can be utilized for the dielectric spacers 114 without departing from the scope of the present disclosure.

Figure 2C:
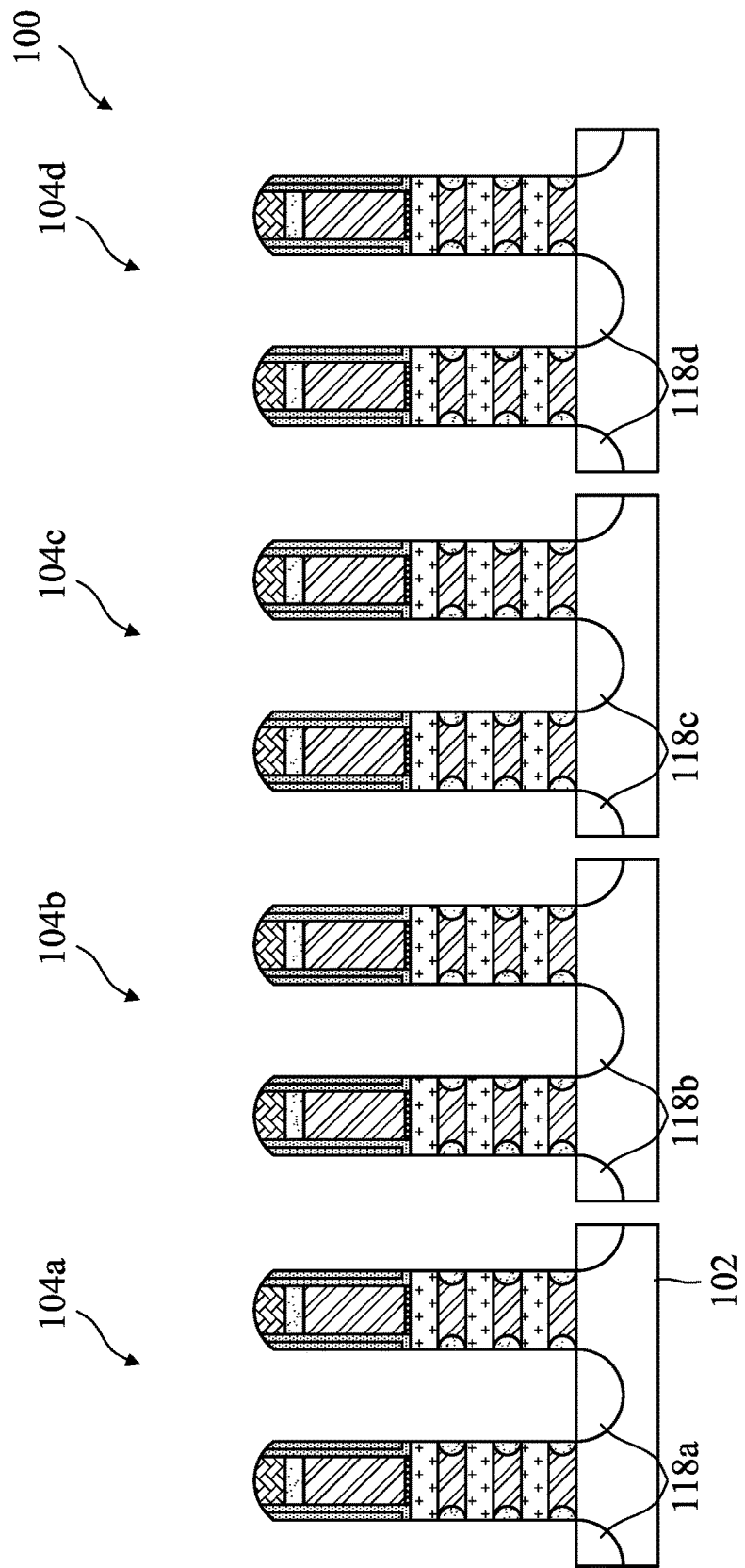

In FIG. 2C, epitaxial semiconductor regions 118a-d have been formed at the bottom of the trenches 150 respectively. When forming the trenches 150 for source/drain regions, the etching process may etch the bottom of the trenches below a depth of the lowest sacrificial semiconductor nanostructure 142 and into the substrate 102. The epitaxial growth process for forming the epitaxial regions 118a-118d provides semiconductor material in the recessed portions of the substrate 102.

The epitaxial semiconductor regions 118a-d can include intrinsic semiconductor material. The epitaxial semiconductor regions 118a-d are grown epitaxially from the substrate 102. The epitaxial semiconductor regions 118a-d may include a same material as the semiconductor substrate 102. In an example in which the substrate 102 is Si, the epitaxial regions 118a-d may include intrinsic Si. In some embodiments, while the semiconductor substrate 102 may be doped, the epitaxial semiconductor regions 118a-d are not doped. The epitaxial semiconductor regions 118a-d may be considered as part of the semiconductor substrate 102. The epitaxial semiconductor regions 118a-d correspond to regrowth of the portions of the semiconductor substrate 102 that were etched when forming the trenches 150. Other processes and materials can be utilized for the epitaxial semiconductor regions 118a-d without departing from the scope of the present disclosure.

Figure 2D:
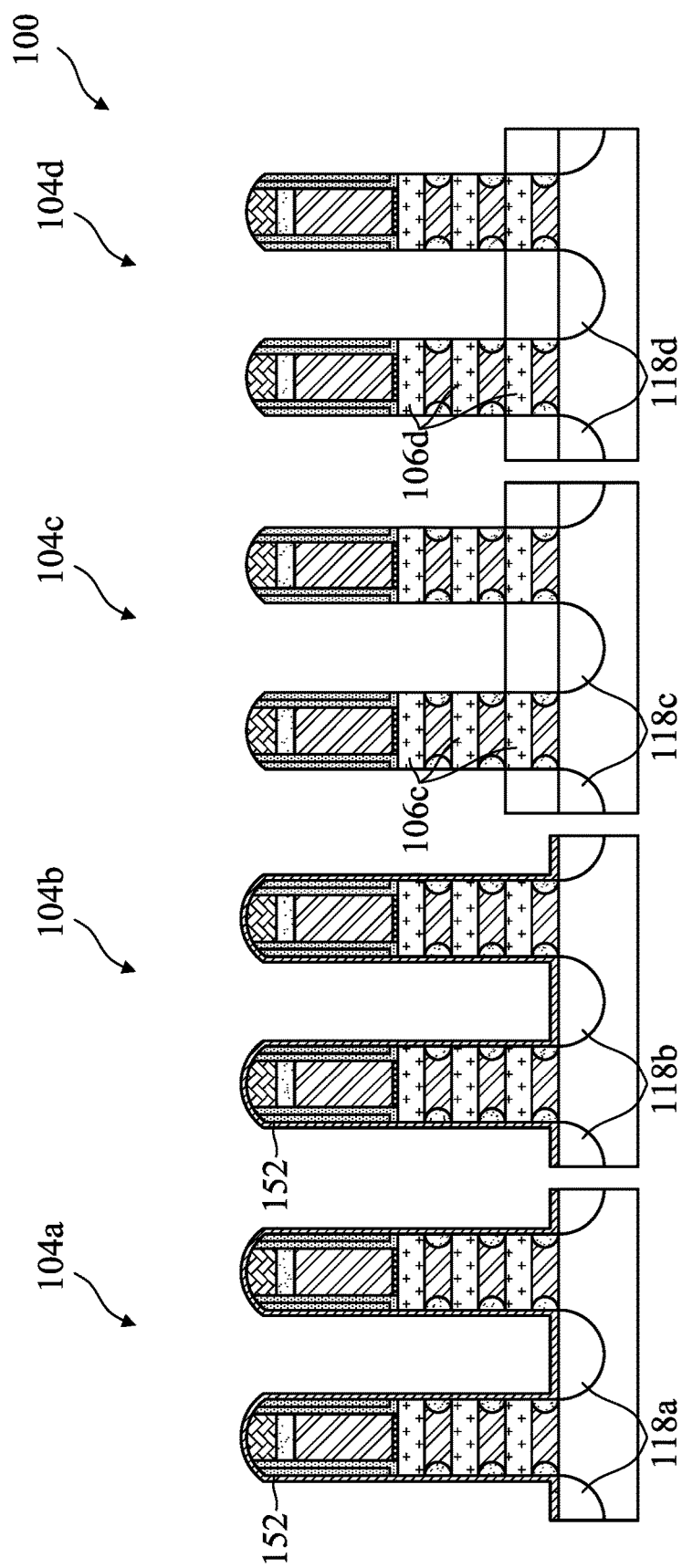

In FIG. 2D, a mask 152 has been formed and patterned on the integrated circuit 100. After patterning, the mask 152 covers the regions of the transistors 104a and 104b. The mask 152 can include a conductive material such as titanium, aluminum, tungsten, or other conductive materials. The mask 152 can include a dielectric material such as silicon nitride, silicon oxynitride, silicon oxide, silicon carbide, silicon oxycarbide, silicon oxycarbonitride, or other suitable dielectric materials. The mask 152 can be deposited by ALD, PVD, CVD, or other processes. The mask 152 can be patterned using photolithography processes. Though not shown in the view of FIG. 2D, the mask 152 may also be formed on exposed portions of trench isolation regions 134.

In FIG. 2D, a second epitaxial growth process is performed. The second epitaxial growth process has the function of increasing the thickness of the epitaxial semiconductor regions 118c and 118d because these regions are not covered by the mask 152. The epitaxial semiconductor regions 118a and 118b are not increase in thickness or height due to the presence of the mask 152, which prevents epitaxial growth. The second epitaxial growth process can also result in intrinsic semiconductor material being added to the epitaxial semiconductor regions 118c and 118d.

In some embodiments, the epitaxial semiconductor regions 118c and 118d have a top surface substantially level with the top surface of the lowest semiconductor nanostructures 106c and 106d. Accordingly, the epitaxial semiconductor regions 118c and 118d are in direct contact with the lowest semiconductor nanostructures 106c and 106d. Alternatively, the extension of the epitaxial semiconductor regions 118c and 118d may correspond to the formation of new epitaxial semiconductor regions on top of the epitaxial semiconductor regions 118c and 118d.

Figure 2E:
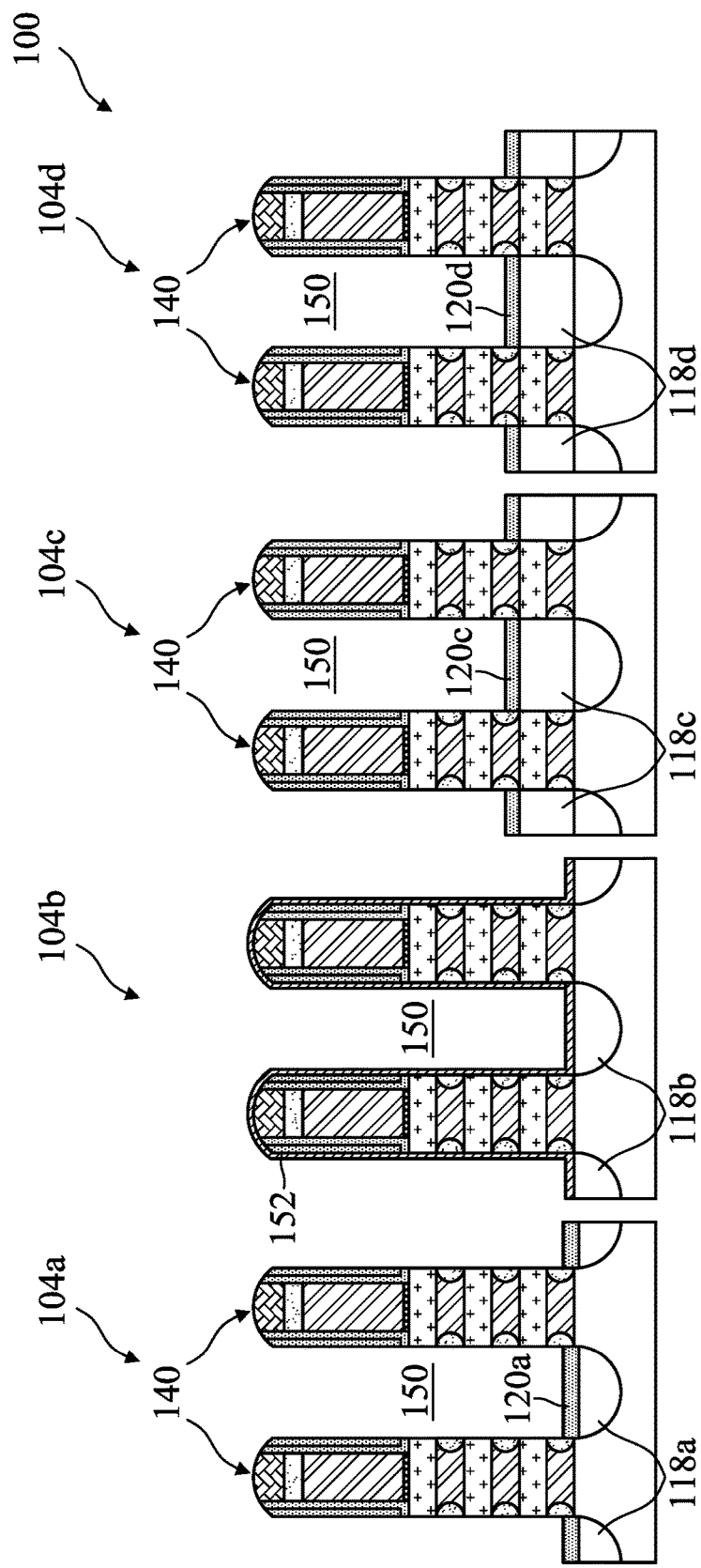

In FIG. 2E, the mask 152 has been further patterned to cover only the region of the transistor 104b, thereby exposing the previously covered region of the transistor 104a. In FIG. 2E, after the further patterning of the mask 152, dielectric isolation structures 120a have been formed on the top surface of the epitaxial semiconductor regions 118a. The dielectric isolation structures 120c have been formed on the top surface of the epitaxial semiconductor regions 118c. Dielectric isolation structures 120d have been formed on the top surface of the epitaxial semiconductor regions 118d. The dielectric isolation structures 120a, 120c, and 120d may have compositions and thicknesses as described in relation to FIG. 1A. A dielectric isolation region is not formed at the transistor 104b due to the presence of the mask 152.

The dielectric isolation structures 120a, 120c, and 120d can be formed by various processes. In one example, a dielectric layer may be deposited in a blanket deposition at the regions of the transistors 104a, 104c, and 104d. The dielectric layer can include silicon nitride, $Al_2O_3$, or other suitable dielectric materials. The dielectric layer can have a thickness between 3 nm and 5 nm. The dielectric layer can be deposited by CVD, ALD, PVD, or other processes. Other materials, thicknesses, and deposition processes can be utilized for the dielectric layer without departing from the scope of the present disclosure.

After deposition of the dielectric layer, a dopant implantation process may be performed. Dopant atoms bombard the integrated circuit 100. The dopant atoms travel substantially straight downward so that the dopant atoms can reach the portions of the dielectric layer at the bottom of the trenches 150. The dopant atoms are embedded into the dielectric layer at the bottom of the trenches 150. Because the dopant atoms travel downward, the portions of the dielectric layer on the sidewalls of the dummy gate structures 140 do not receive dopant atoms. As will be described in further detail in relation to FIG. 2E, the dopant atoms change the properties of the dielectric layer at the bottoms of the trenches 150. The dopant atoms may include ions.

In some embodiments, the dopant atoms are carbon ions. Accordingly, in an example in which the dielectric layer is silicon nitride, the portions of the dielectric layer and the bottom of the trenches 150 become SiCN. In another example, the dopant atoms are oxygen ions, resulting in the portions of the dielectric layer at the bottom of the trenches becoming SiON. Other suitable types of ions or particles can be used to render the dielectric layer selectively etchable with respect to the transformed portions of the dielectric layer at the bottom of the trenches 150. Accordingly, various other materials can be utilized for the dielectric layer and for the dopant atoms without departing from the scope of the present disclosure. While the description of FIG. 2E describes implantation of dopant atoms, dopant species such as compounds or molecules can be utilized.

In FIG. 2E, dielectric isolation structures 120a, 120c, and 120d have been formed from the dielectric layer at the bottom of the trenches 150. The dielectric isolation structures 120a, 120c, and 120d are formed during the ion bombardment process described in relation to FIG. 2E. Formation of the dielectric isolation structures 120a, 120c, and 120d may also include performing a thermal annealing process after ion implantation. The dielectric isolation structures 120a, 120c, and 120d are positioned in direct contact with the epitaxial semiconductor regions 118a, 118c, and 118d at the bottom of the trenches 150.

The dielectric isolation structures 120a, 120c, and 120d may have a thickness between 1 nm and 15 nm. This thickness may be sufficiently thick to ensure substantially no leakage current, but not so thick as to adversely affect the potential thickness of a source/drain region that will be formed thereon. Other thicknesses can be utilized without departing from the present disclosure. Other processes and materials can be utilized to form the dielectric isolation structures 120a, 120c, and 120d.

Figure 2F:
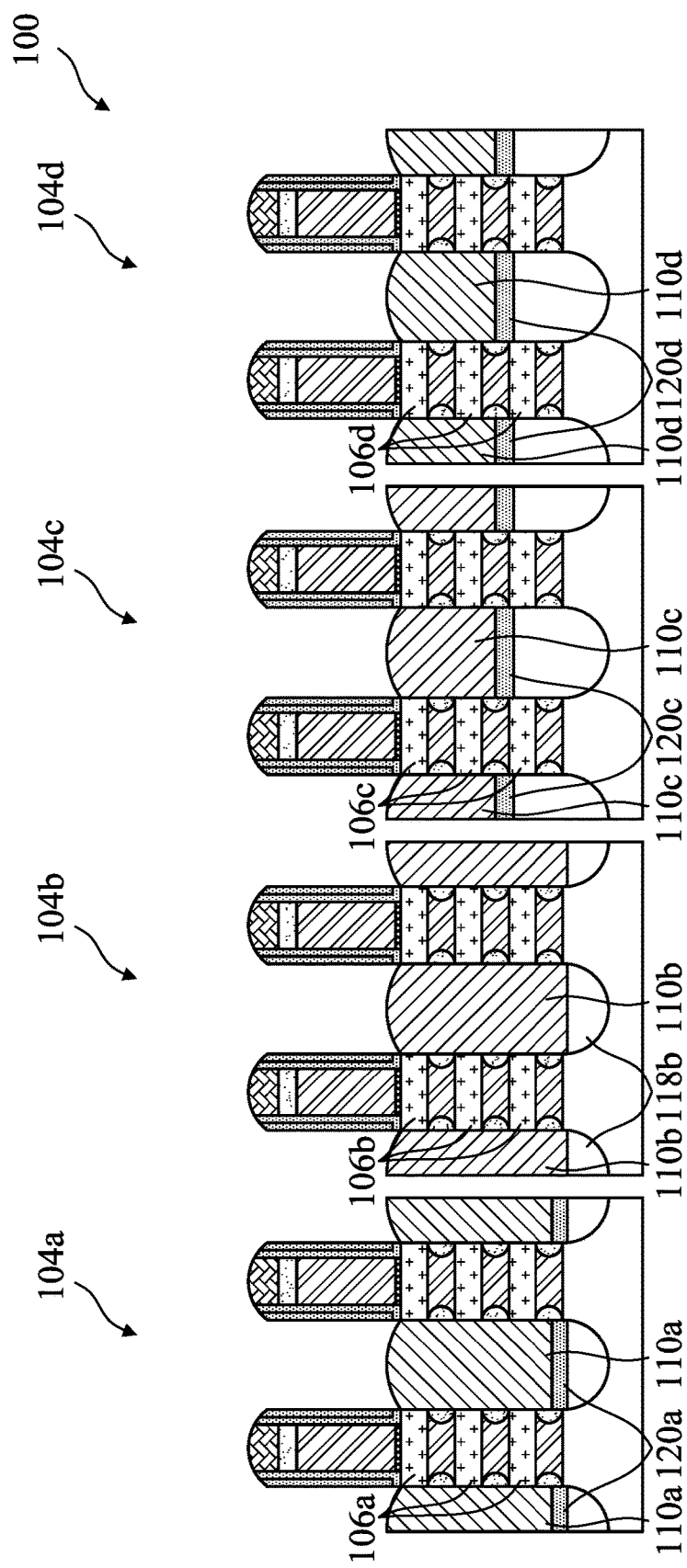

In FIG. 2F source/drain regions 110a-d have been formed on the dielectric isolation structures 120a, 120c, 120d, and on the epitaxial semiconductor region 118b. The source/drain regions 110a-d may be grown epitaxially from the semiconductor nanostructures 106a-d. The source/drain regions 110a and 110d may be doped in situ with N-type dopant atoms. The source/drain regions 110a and 110d of the N-type transistors 104a and 104d may include a same material as the semiconductor nanostructures 106a and 106d. The source/drain regions 110b and 110c may be doped in situ with P-type dopant atoms. The source/drain regions 110b and 110c of the P-type transistors 104b and 104c may include a same material as the semiconductor nanostructures 106b and 106c. Alternatively, the source/drain regions 110a-d may include a different material than the semiconductor nanostructures 106a-d. The N-type source/drain regions 110a and 110d may be formed in a first epitaxial growth step. The P-type source/drain regions 110b and 110c may be formed in a second epitaxial growth step. Though not shown in FIG. 2F, it is possible that source/drain regions 110d may be higher than the source/drain region 110a due to the epitaxial region 118d being higher than the epitaxial region 118a. Though not shown in FIG. 2F, the source/drain region 110c may be higher than the source/drain regions 110b due to the epitaxial region 118c being higher than the epitaxial region 118b.

The source/drain regions 110a, 110c, and 110d are positioned directly on top of the dielectric isolation structures 120a, 120c, and 120d. The source/drain regions 110b are formed directly on the epitaxial semiconductor region 118b.

Figure 2G:
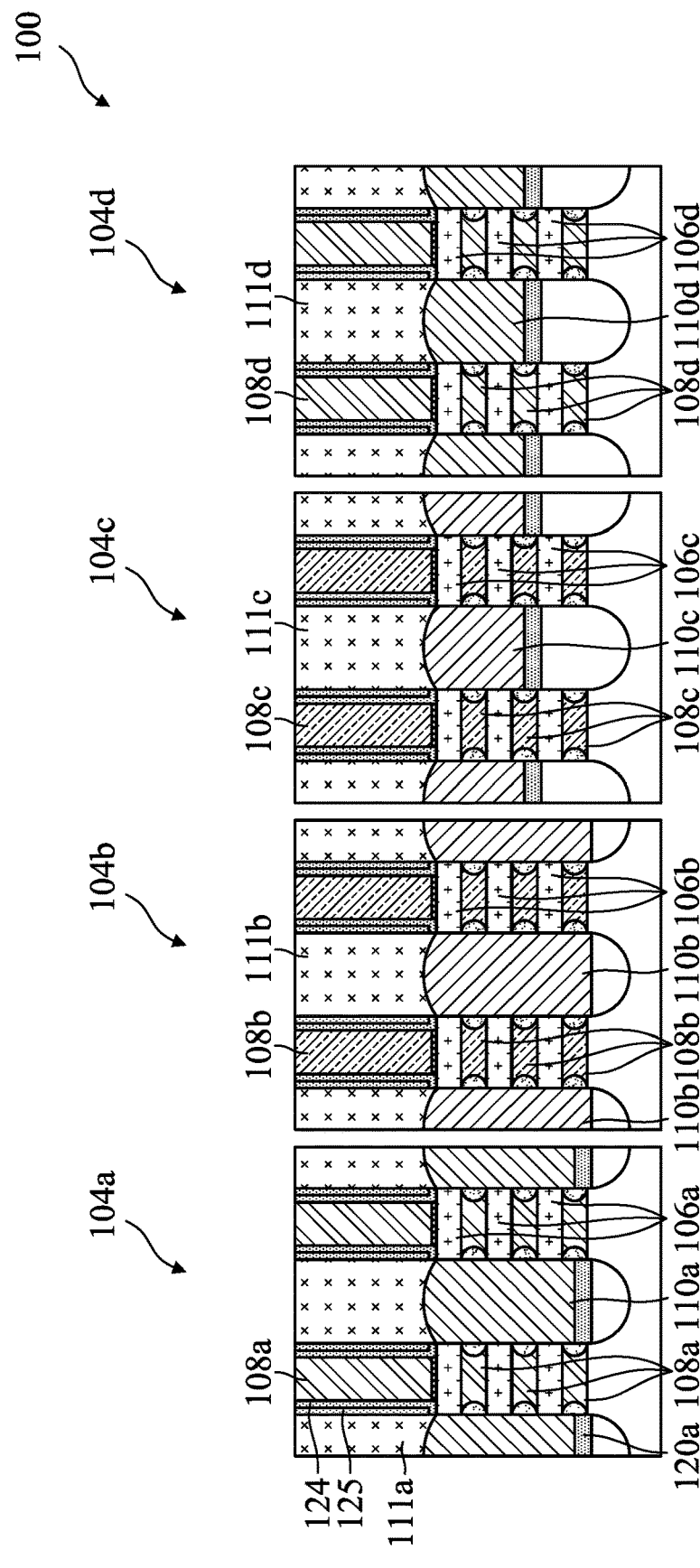

In FIG. 2G, processing of the transistors 104a-d is complete. The transistors 104a-d of FIG. 2G correspond to the transistors 104a-d of FIG. 1A. The polysilicon layer 144 and the dielectric layers 146 and 148 of the dummy gate structures 140 have been removed. After removal of the polysilicon layer 144, the sacrificial semiconductor nanostructures 142 are removed with an etching process that selectively removes the sacrificial semiconductor nanostructures 142 with respect to the semiconductor nanostructures 106a-d.

After removal of the sacrificial semiconductor nanostructures 142, a gap remains where the sacrificial semiconductor nanostructures 142 were. The semiconductor nanostructures 106a-d are exposed. A gate dielectric layer (not shown) is deposited surrounding the semiconductor nanostructures 106a-d. The gate dielectric layer may include an interfacial dielectric layer and the high K dielectric layer. The interfacial dielectric layer may include silicon oxide of a thickness between 2 Å and 10 Å. The high K dielectric layer is deposited on the interfacial dielectric layer and may include hafnium oxide. The high K dielectric layer may have a thickness between 5 Å and 20 Å. The materials of the gate dielectric layer may be deposited by ALD, CVD, or PVD. Other structures, materials, thicknesses, and deposition processes may be utilized for the gate dielectric layer without departing from the scope of the present closure.

After deposition of the gate dielectric layer around the semiconductor nanostructures 106a-d, gate electrodes 108a-d are formed. The gate metal 108a-d can include one or more metal layers including tungsten, copper, aluminum, titanium, gold, tantalum, titanium nitride, tantalum nitride, or other suitable materials. The gate metal 108a-d can be deposited by ALD, PVD, or CVD. The gate metal 108a-d fills all remaining spaces around the semiconductor nanostructures 106a-d and fills the remaining spaces vacated by removal of the polysilicon layer 144. Other materials, thicknesses, deposition processes, and structures can be utilized for the gate electrodes 108a-d without departing from the scope of the present disclosure. In practice, the gate metals 108a and 108d may have different compositions than the gate metals 108b and 108c. In particular, different numbers of layers and metals may be utilized for the gate electrodes 108a-d in order to achieve desired threshold voltages for the N-type transistors 104a and 104d and the P-type transistors 104b and 104c.

Figures 2H, 2I, 2J:
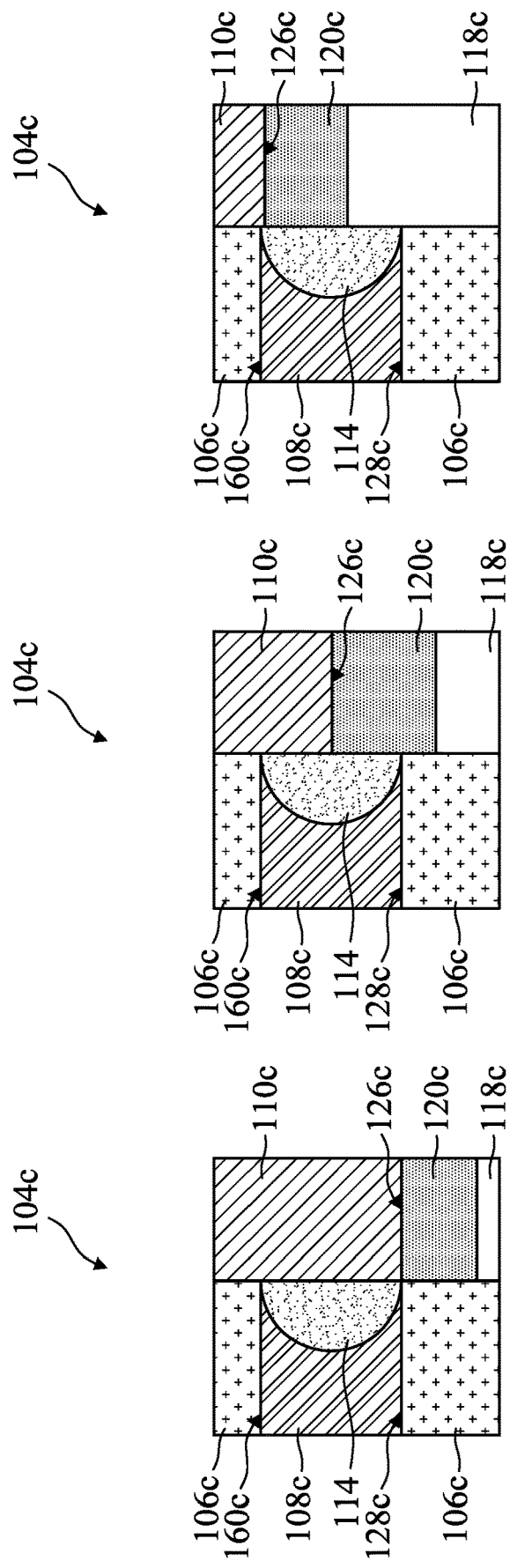

FIGS. 2H-2J are enlarged views of a portion of the transistor 104c of FIG. 2G, in accordance with some embodiments. FIGS. 2H-2J illustrates some potential differences in relative positions of the source/drain regions 110c, the semiconductor nanostructures 106c, the dielectric isolation structures 120c, and the dielectric spacer structures 114. The transistor 104d may have relative positions similar to those shown for the transistor 104c in FIGS. 2H-2J.

In FIG. 2H, the bottom surface 126c of the source/drain region 110c is substantially even with the top surface 128c of the lowest semiconductor nanostructure 106c. Correspondingly, the top surface of the dielectric isolation structure 120c substantially even with the top surface 128c of the lowest semiconductor nanostructure 106c. This may be an undesirable configuration due to the risk that there may be a current path between the lowest semiconductor nanostructure 106c and the source/drain region 110c. In practice, the top surface of the dielectric isolation structure 120c may be higher or lower than the top surface of the lowest semiconductor nanostructure 106c. Also, the top surface of the dielectric isolation structure 120c may or may not be substantially flat as shown in FIG. 2H.

In FIG. 2I, the bottom surface 126c of the source/drain region 110c is lower than the bottom surface 160c of the second lowest semiconductor nanostructure 106c and higher than the top surface 128c of the lowest semiconductor nanostructure 106c.

In FIG. 2J, the bottom surface 126c of the source/drain regions 110c is substantially even with the bottom surface 160c of the second lowest semiconductor nanostructure 106c. In this case, the bottom surface 126c of the source/drain regions 110c is substantially even with the top surface of the dielectric spacer 114.

In some embodiments, only N-type transistors have a larger number of active semiconductor nanostructures. In other embodiments, only P-type transistors have a larger number of active semiconductor nanostructures. In some embodiments, P-type transistors with fewer numbers of active semiconductor nanostructures do not include a dielectric isolation structure. In some embodiments, only N-type transistors have reduced numbers of active semiconductor nanostructures. In some embodiments, only P-type transistors have reduced numbers of active semiconductor nanostructures.

FIG. 2K is a cross-sectional view of the integrated circuit 100 substantially similar to the view shown in FIG. 1C. In FIG. 2K, a dielectric structure 162 has been formed above one of the hybrid fin structures 136. The dielectric structure 162 electrically isolates the source/drain contact 111d from the source/drain contact 111c. Other dielectric structures 162 can be formed to isolate other source/drain contacts from each other. The dielectric structure 162 can include SiN, SiON, SiOCN, SiOC, SiCN, SiO, AlO, HfO, or other suitable dielectric materials.

FIG. 2L is a cross-sectional view of the integrated circuit 100 substantially similar to the view shown in FIG. 1D. In FIG. 2L, a dielectric structure 164 has been formed above one of the hybrid fin structures 136. The dielectric structure 164 electrically isolates the gate metal 108d from the gate metal 108c. Other dielectric structures 164 can be formed to isolate other gate metals from each other. The dielectric structure 164 can include SiN, SiON, SiOCN, SiOC, SiCN, SiO, AlO, HfO, or other suitable dielectric materials.

Figure 3:
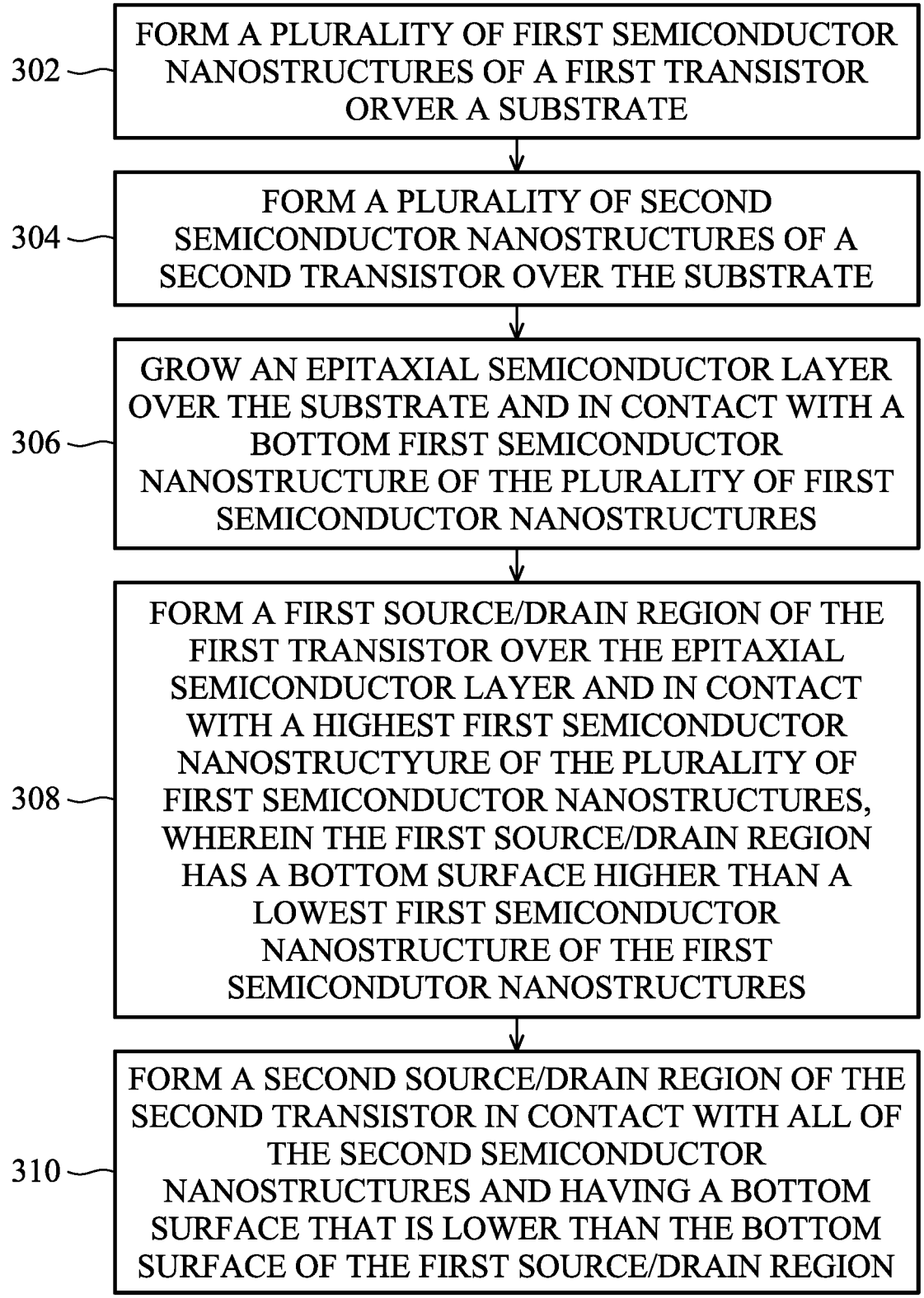
FIG. 3 is a flow diagram of a process for forming an integrated circuit, in accordance with some embodiments.

FIG. 3 is a flow diagram of a method 300 for forming an integrated circuit, in accordance with some embodiments. The method 300 can utilize processes, structures, and components described in relation to FIGS. 1A-2L. At 302, the method 300 includes forming a plurality of first semiconductor nanostructures of a first transistor over a substrate. One example of a first transistor is the transistor 104d of FIG. 1A. One example of a substrate is the substrate 102 of FIG. 1A. One example of first semiconductor nanostructures are the semiconductor nanostructures 106d of FIG. 1A. At 304, the method 300 includes forming a plurality of second semiconductor nanostructures of a second transistor over the substrate. One example of a second transistor is the transistor 104a of FIG. 1A. One example of second semiconductor nanostructures are the semiconductor nanostructures 106a of FIG. 1A. At 306, the method 300 includes growing an epitaxial semiconductor layer over the substrate and in contact with a bottom first semiconductor nanostructure of the plurality of first semiconductor nanostructures one example of an epitaxial semiconductor layer is the epitaxial semiconductor layer 118d of FIG. 1A. At 308, the method 300 includes forming a first source/drain region of the first transistor over the epitaxial semiconductor layer and in contact with a highest first semiconductor nanostructure of the plurality of first semiconductor nanostructures, wherein the first source/drain region has a bottom surface higher than a lowest first semiconductor nanostructure of the first semiconductor nanostructures. One example of a first source/drain region is the source/drain region 110d of FIG. 1A. One example of a bottom surface is the bottom surface 126d of FIG. 1A. At 310, the method 300 includes forming a second source/drain region of the second transistor in contact with all of the second semiconductor nanostructures and having a bottom surface that is lower than the bottom surface of the first source/drain region. One example of a second source/drain region is the source/drain region 110a of FIG. 1A. One example of a bottom surface is the bottom surface 126a of FIG. 1A.

Embodiments of the present disclosure provide an integrated circuit with nanostructure transistors having differing effective channel widths while having substantially the same area overheads. Each transistor has a plurality of stacked nanostructures corresponding to the channel regions of the transistors. The effective channel width of each transistor corresponds to the combined widths of the stacked nanostructures. Each transistor initially has a same number of stacked nanostructures. The effective channel width of a transistor is adjusted by forming the source/drain regions to connect only to a selected number of the stacked nanostructures. The depth of the source/drain regions is controlled by selectively performing an epitaxial growth that effectively extends the height of the substrate in regions for which fewer channels will be connected to the source/drain regions. The larger the number of nanostructures connected to the source/drain regions of a transistor, the larger the effective channel width of the transistor.

Selectively controlling the effective channel width as described above enables formation of transistors or groups of transistors with specific characteristics. For example, lower power devices can be formed by reducing the number of channels connected to the source/drain regions. Higher speed devices can be formed by connecting a larger number of channels to the source/drain regions. Furthermore, transistors having differing effective channel widths can take up substantially the same amount of substrate area. The result is an integrated circuit that has dedicated high-speed devices and low power devices without increased design complexity and without area penalties. Device performance and wafer yield are improved.

In some embodiments, an integrated circuit includes a substrate and a first transistor over the substrate. The first transistor includes a plurality of stacked first semiconductor nanostructures corresponding to channel regions of the first transistor and a first source/drain region in contact with each of the first semiconductor nanostructures. The integrated circuit includes a second transistor over the substrate. The second transistor includes a plurality of stacked second semiconductor nanostructures and a second source/drain region in contact with a highest second semiconductor nanostructure of the second semiconductor nanostructures and having a bottom surface that is higher than a lowest second semiconductor nanostructure of the second semiconductor nanostructures.

In some embodiments, a method includes forming a plurality of first semiconductor nanostructures of a first transistor over a substrate and forming a plurality of second semiconductor nanostructures of a second transistor over the substrate. The method includes growing an epitaxial semiconductor layer over the substrate and in contact with a bottom first semiconductor nanostructure of the plurality of first semiconductor nanostructures and forming a first source/drain region of the first transistor over the epitaxial semiconductor layer and in contact with a highest first semiconductor nanostructure of the plurality of first semiconductor nanostructures. The first source/drain region has a bottom surface higher than a lowest first semiconductor nanostructure of the first semiconductor nanostructures. The method includes forming a second source/drain region of the second transistor in contact with all of the second semiconductor nanostructures and having a bottom surface that is lower than the bottom surface of the first source/drain region.

In some embodiments, an integrated circuit includes a substrate and a first transistor over the substrate. The first transistor includes a plurality of stacked first semiconductor nanostructures, a first gate metal surrounding each of the first semiconductor nanostructures, and a first source/drain region in contact a highest first semiconductor nanostructure of the first semiconductor nanostructures and electrically isolated from a lowest first semiconductor nanostructure of the first semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a substrate;
   a first transistor over the substrate and including:
      a plurality of stacked first semiconductor nanostructures corresponding to channel regions of the first transistor;
      a first source/drain region in contact with each of the first semiconductor nanostructures; and
      a first epitaxial semiconductor layer embedded in the substrate and below the first source/drain region, the first epitaxial semiconductor layer having a top surface that is lower than a lowest one of the first semiconductor nanostructures and comprising a first intrinsic semiconductor material; and
   a second transistor over the substrate and including:
      a plurality of stacked second semiconductor nanostructures;
      a second source/drain region in contact with a highest second semiconductor nanostructure of the second semiconductor nanostructures and having a bottom surface that is higher than a lowest second semiconductor nanostructure of the second semiconductor nanostructures;
      a second epitaxial semiconductor layer on the substrate and below the second source/drain region, the second epitaxial semiconductor layer comprising a second intrinsic semiconductor material; and
      a second dielectric isolation structure over the second epitaxial semiconductor layer separating the second epitaxial semiconductor layer from the second source/drain region.

2. The integrated circuit of claim 1, wherein:
   the first transistor further includes,
   a first dielectric isolation structure over the first epitaxial semiconductor layer separating the first epitaxial semiconductor layer from the first source/drain region.

3. The integrated circuit of claim 2, wherein the first and second transistors are N-type transistors.

4. The integrated circuit of claim 1, wherein; the first epitaxial semiconductor layer is in contact with the first source/drain region.

5. The integrated circuit of claim 4, wherein the first and second transistors are P-type transistors.

6. The integrated circuit of claim 1, wherein the highest second semiconductor nanostructure is a channel region of the second transistor, wherein the lowest second semiconductor nanostructure does not function as a channel region of the second transistor.

7. The integrated circuit of claim 1, wherein:
   the first transistor includes a first gate metal surrounding each of the first semiconductor nanostructures; and
   the second transistor includes a second gate metal surrounding each of the second semiconductor nanostructures.

8. The integrated circuit of claim 1, wherein there is same number of first semiconductor nanostructures and second semiconductor nanostructures.

9. The integrated circuit of claim 1, wherein the second transistor includes:
   a gate metal surrounding each of the second semiconductor nanostructures; and
   a plurality of dielectric inner spacer structures each positioned adjacent to the gate metal between a respective pair of second semiconductor nanostructures,
   wherein the second epitaxial semiconductor in contact with the lowest second semiconductor nanostructure, and
   wherein the second dielectric isolation structure is in contact with at least one of the dielectric inner spacer structures.

10. The integrated circuit of claim 9, wherein the bottom surface of second source/drain region is higher than a top surface of the at least one dielectric isolation structure.

11. An integrated circuit, comprising:
    a substrate; and
    a first transistor over the substrate and including:
       a plurality of stacked first semiconductor nanostructures;
       a first gate metal surrounding each of the first semiconductor nanostructures; and
       a first source/drain region in contact with a highest first semiconductor nanostructure of the first semiconductor nanostructures and electrically isolated from a lowest first semiconductor nanostructure of the first semiconductor nanostructures, the first source/drain region comprising a doped semiconductor material; and an epitaxial semiconductor layer between the substrate and the first source/drain region, the epitaxial semiconductor layer comprising an intrinsic semiconductor material.

12. The integrated circuit of claim 11, wherein the first transistor includes a dielectric isolation structure between the epitaxial semiconductor layer and the first source/drain region.

13. The integrated circuit of claim 11, comprising a second transistor over the substrate and including:
a plurality of stacked second semiconductor nanostructures corresponding to channel regions of the second transistor; and
a second source/drain region in contact with each of the second semiconductor nanostructures.

14. The integrated circuit of claim 13, wherein a bottom surface of the second source/drain region is lower than a bottom surface of the first source/drain region.

15. The integrated circuit of claim 14, wherein a vertical dimension of the second source/drain region is larger than a vertical dimension of the first source/drain region.

16. The integrated circuit of claim 11, wherein the epitaxial semiconductor layer and the substrate comprise a same semiconductor material.

17. A device, comprising:
a substrate;
a first transistor including a plurality of first stacked channels;
a second transistor including a plurality of second stacked channels over the substrate;
a first epitaxial semiconductor layer over the substrate and in contact with a bottom first channel of the plurality of first stacked channels, the first epitaxial semiconductor layer comprising a first intrinsic semiconductor material;
a first source/drain region of the first transistor over the first epitaxial semiconductor layer and in contact with a highest first channel of the plurality of first stacked channels, wherein the first source/drain region has a bottom surface higher than a lowest first channel nanostructure of the first stacked channels, the first source/drain region comprising a first doped semiconductor material of a first conductivity type; and
a second source/drain region of the second transistor in contact with all of the second channels and having a bottom surface that is lower than the bottom surface of the first source/drain region, the second source/drain region comprising a second doped semiconductor material of a second conductivity type different from the first conductivity type.

18. The device of claim 17, further comprising:
a first gate metal surrounding each of the first channels; and
a second gate metal surrounding each of the second channels.

19. The device of claim 18, further comprising a second epitaxial semiconductor region between the substrate and the second source/drain region, the second epitaxial semiconductor region comprising a second intrinsic semiconductor material and having a top surface that is lower than a top surface of the first epitaxial semiconductor layer.

20. The device of claim 19, further comprising a dielectric isolation structure on the first epitaxial semiconductor layer, the first source/drain region being on the dielectric isolation structure.

* * * * *